(12) United States Patent
Sofue et al.

(10) Patent No.: US 6,380,617 B1
(45) Date of Patent: Apr. 30, 2002

(54) ELECTRODE TERMINAL CONNECTION STRUCTURE OF SEMICONDUCTOR MODULE

(75) Inventors: Kenichi Sofue; Hiromitsu Yoshiyama; Toshinari Fukatsu; Toshiaki Nagase, all of Aichi (JP)

(73) Assignee: Kabushiki Kaisha Toyoda Jidoshokki Seisakusho, Kariya (JP)

( * ) Notice: Subject to any disclaimer, the term of this patent is extended or adjusted under 35 U.S.C. 154(b) by 0 days.

(21) Appl. No.: 09/389,329

(22) Filed: Sep. 3, 1999

(30) Foreign Application Priority Data

Sep. 8, 1998 (JP) .......................................... 10-253611

(51) Int. Cl.[7] .......................... H01L 23/52; H01L 23/48; H01L 23/34; H01L 23/10; H01L 23/28
(52) U.S. Cl. ...................... 257/691; 257/724; 257/735; 257/787; 257/694; 257/723; 257/695; 257/706
(58) Field of Search ................................ 257/723, 724, 257/691, 735, 787, 694, 695, 706; 361/792, 794, 704, 707

(56) References Cited

U.S. PATENT DOCUMENTS 5,347,158 A * 9/1994 Matsuda et al.
5,521,437 A * 5/1996 Oshima et al.
5,616,955 A * 4/1997 Yamada et al.
5,777,377 A * 7/1998 Gilmore

FOREIGN PATENT DOCUMENTS

| EP | 0 578 108 A1 | 1/1994 | ........... H01L/25/16 |
| EP | 0 588 094 A1 | 3/1994 | ........... H01L/23/64 |
| JP | 10-22451 | 1/1998 | ........... H01L/25/07 |
| JP | 10-225139 | 8/1998 | |

* cited by examiner

Primary Examiner—David E. Graybill
(74) Attorney, Agent, or Firm—Morgan & Finnegan, LLP

(57) ABSTRACT

The side of one of the source electrodes 7a and 7b of two semiconductor modules Q1 and Q2 corresponding to a pair of upper and lower arms are installed parallel with the outer side of the other source electrode inside packages 8a and 8b. Both the modules are arranged parallel to one another in such a way that both the sides are opposed, an inter-module electrode terminal 15 for connecting the source electrode 7a of the module Q1 and the drain electrode (base substrate) 6b of the module Q2 is formed in a block shape, and one end of the inter-module electrode terminal 15 is vertically installed parallel and close to the side of the source electrode 7b on the base substrate of the module Q2. A positive electrode terminal 12 made of a block of a conductive metal is vertically installed so as to be electrically connected with both the base substrate 6a of the module Q1 and the lower positive electrode 10 of a bus electrode panel 5 parallel and close to the side of the source electrode 7a and to mechanically support the bus electrode panel 5.

2 Claims, 4 Drawing Sheets

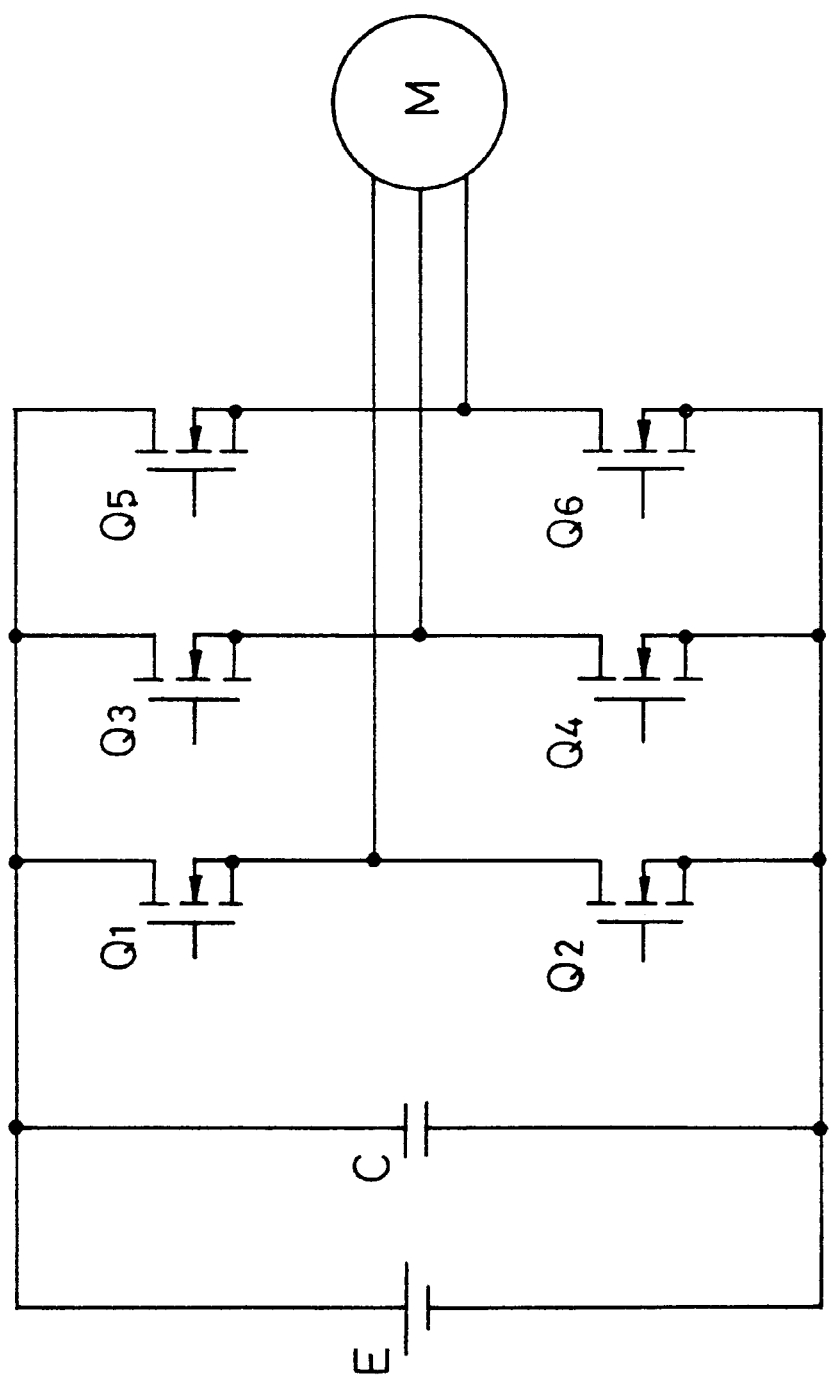
F I G. 1

ELECTRODE TERMINAL CONNECTION STRUCTURE OF SEMICONDUCTOR MODULE

BACKGROUND OF THE INVENTION

1. Field of the Invention

The present invention relates to an electrode terminal connection structure for connecting a non-insulated semiconductor module to a dual inverter structure used in the motor control apparatus for industrial vehicles.

2. Description of the Prior Art

Conventionally, a semiconductor module with a large current capacity is used as the switching device of an inverter directly supplying a main motor with electric power in a motor control apparatus used in battery-powered vehicles, such as a battery forklift, etc. A semiconductor module is obtained by incorporating a plurality of power semiconductor chips into one insulated package, and there are modules with a variety of internal compositions, such as a module in which the current capacity is increased by simply incorporating chips of the same kind in parallel, a module in which a simple circuit is composed of a plurality of kinds of chips, a module in which a drive circuit composed of semiconductor chips is embedded, etc. Usually the package is made of plastic, and the concavity inside the package is filled with a gel and epoxy insulating agent from the bottom to prevent a chip peripheral circuit from oxidizing.

Since a semiconductor module is used to control a large current, a semiconductor module generates a lot of heat. For this reason, a non-insulated type is generally used in which semiconductor chips, being the current control circuit of a heat source, are directly mounted on a heat-radiating substrate with both a high thermal capacity and a high heat-radiation efficiency (highly heat-conductive) and in which the heat-radiating substrate itself is used as one electrode. Usually the heat-radiating substrate of a semiconductor module having such a structure is provided with a heat sink made of aluminum, etc., and is highly heat-conductive as a heat-radiating material to improve the radiation efficiency, which also serves to secure the semiconductor module itself.

A switching frequency usually used in a semiconductor module structured in this way, for example, in the above-described battery vehicle, is approximately 10 kHz.

When a semiconductor module structured as described above is actually used at the above-described switching frequency, the occurrence of a large inductance in the wiring of an internal circuit and the wiring connecting the semiconductor module to the outside cannot be avoided, and the occurrence of a large inductance causes a fairly large loss of switching power (hereinafter called a "switching loss") when a switching element is turned off. When the switching element is turned off, a fairly large surge voltage also occurs, which electrically damages the internal circuit.

This switching loss is an electric power loss occurring inside the semiconductor module when a device with a control electrode like the above-described semiconductor switch performs switching, and since usually many (5 or 6) semiconductor switches are used in the above-described motor control apparatus, the total switching loss occurring in these switches becomes a serious problem. This large loss, for example, greatly affects the drive and operation of the above-described battery vehicle, etc., and thermally damages the semiconductor switches since the lost electric power is converted into heat.

Conventionally, the reduction of the wiring inductance, that is, the reduction of both the switching loss and surge voltage has been realized by arranging two pieces of electrode wiring for the main current (for example, in the case of a MOS FET, source electrode wiring and drain electrode wiring) through which a large current flows in and out of the semiconductor module in opposite directions as input and output, in parallel and as close as possible to each other as much as possible and by causing an electro-magnetic effect which offsets (cancels) the two pieces of wiring inductance due to a reciprocal induction function.

FIG. 1 is the circuit diagram of an inverter used in the above-described semiconductor module, and each of the switching elements Q1 through Q6 shown in FIG. 1 correspond to one semiconductor module.

Then, the rotation of a three-phase motor M can be controlled by inputting a control signal from a drive circuit, which is not shown in FIG. 1, to the gate electrode of each switching element (semiconductor module).

Two of the above-described inverters, that is, one for driving and the other for lifting are needed in industrial vehicles, such as a battery-powered forklift, etc. Recently, a dual inverter structure 1 in which a small size, light weight and low cost can be realized by arranging two inverters 2 and 3 in parallel, making the inverters share common power capacitors, bus electrodes, etc., and thereby realizing a single module, as shown in FIGS. 2A and 2B (2A and 2B are a top view and side view, respectively), is proposed.

FIG. 3 is a side view in which the conventional connection structure of a pair of modules corresponding to a pair of upper and lower arms in the case where Q1 and Q2 shown in the circuit diagram (FIG. 1) are paired, are extracted and enlarged. Since the current flowing in the circuit is relatively small and thereby gate electrodes are not affected much by the wiring inductance, the gate electrodes are omitted in FIG. 3.

As shown in FIG. 3, the semiconductor modules used have a non-insulated structure in which base substrates 6a and 6b are also used as drain electrodes and in which source electrodes 7a and 7b are vertically installed along the inner sides of packages 8a and 8b from the joint part mounted on the upper surfaces of package 8a and 8b, as shown in dotted lines.

The semiconductor module has a sandwich structure in which a sufficiently thin insulation sheet 9 is inserted. The two extensions of a positive electrode 10 beneath the lower surface and a negative electrode 11 of a bus electrode plate 5 located above inverters 2 and 3 are used as a positive electrode terminal 12 and a negative electrode terminal 13, respectively, are extended to the drain electrode 6a of the Q1 module and the source electrode 7b of the Q2 module, respectively, and are connected and secured using screws 14.

The source electrode 7a of the Q1 module and the drain electrode 6b are connected using an inter-electrode terminal 15 made of copper plate, and a part of the terminal constitutes the output part to a drive motor M.

The positive electrode terminal 12 is divided into two parts in the longitudinal direction, and the inter-module electrode terminal 15 is positioned between the divided terminals.

However, according to the conventional semiconductor module connection structure in the above-described dual inverter structure 1, the electrode terminals 12, 13 and 15 connected to each semiconductor module correspond to the two extensions of the electrode plates 10 and 11 of the bus electrode plate 5 and a single copper plate, respectively, and as shown as D in FIG. 3, gaps are provided between the packages 8a and 8b in order to make tools, such as a driver, etc., easy to access if they are secured with screws 14, and the source electrodes 7a and 7b inside the packages 8a and 8b of the semiconductor module and the vertical portions of the electrode terminals 12 and 15, respectively, are separated and geometrically parallel. For this reason, the offset effect of the wiring inductance due to the reciprocal induction function in the vertical portions cannot be expected and thereby both surge voltage and switching loss are proportional.

Since many electrolytic capacitors are mounted as power capacitors 4 on the bus electrode plate 5, the weight of the semiconductor module becomes large, and thereby according to the conventional structure, reinforcing materials, such as a bracket 16, etc., must be installed in order to support the bus electrode plate 5 above the entire circuit.

SUMMARY OF THE INVENTION

An object of the present invention is to provide an electrode structure of a semiconductor module such that both surge voltage and switching loss can be greatly reduced by realizing a dual inverter structure in which there is no need to install reinforcing materials, such as a bracket, etc., when a semiconductor module is connected to the dual inverter structure and in which the offset of wiring inductance due to a reciprocal induction function can be realized even both in the side of the source electrode inside a package and in the vertical portion of an electrode terminal inside a package.

Although the present invention aims to solve the problem of a semiconductor switch consisting of MOS FETS, the present invention is not limited to this, but can also be applied to other semiconductor switches consisting of bipolar transistors, thyristors, etc., which have the same problem as the semiconductor switch consisting of MOS FETs. Since the description of the respective electrode varies depending on the kind of semiconductor switch, for simplicity a main current input electrode, a main current output electrode and a control electrode are used here taking into consideration the function of the electrodes.

For example, in the case of a semiconductor switch consisting of MOD FETs, a drain electrode, a source electrode and a gate electrode correspond to the main current input electrode, the main current output electrode and the control electrode, respectively.

In order to solve the above-described problem, first the present invention is applied to an electrode terminal connection structure connecting a non-insulated semiconductor module in which a conductive base substrate is also used as a main current input electrode, to a dual inverter structure. The present invention has a structure in which electrode terminals for inputting the main current from outside the semiconductor module to the base substrate as the main current input electrode are vertically installed on the base substrate in such a way that the electrode terminals are parallel with and close to a main current output electrode vertically installed inside the package of the semiconductor module, for which the current flows in opposite directions through the portions closely located and parallel to the source electrode and the electrode terminal.

Thus, wiring inductance is offset due to a reciprocal induction function even between the source electrode inside a package and the vertical portion of an electrode terminal, and a great reduction in both surge voltage and switching loss can be realized.

According to the present invention, both the more secure vertical mounting of electrode terminals and the support of a bus electrode plate can be realized by forming a block of an electrode terminal in a block shape, and thereby both the simplification and light weight of the entire dual inverter structure can be realized.

The electrode terminals formed in a block shape can be secured to the base substrate with screws passing through the base substrate from the top.

Thus, the gap provided between the inner side of a package along which a source electrode is vertically installed and an electrode terminal in the conventional structure can be eliminated, the source electrode inside the package and the electrode terminal can be located parallel and close to each other and thereby the wiring inductance offset effect due to the reciprocal induction function can be utilized by passing current in opposite directions through the source electrode and the electrode terminal.

BRIEF DESCRIPTION OF THE DRAWINGS

FIG. 1 is the circuit diagram of an inverter used to control a motor.

DESCRIPTION OF THE PREFERRED EMBODIMENT

The preferred embodiment of the present invention is described below with reference to the drawings.

As described above, although the present invention is described using an example of a semiconductor module consisting of MOS FETs, the present invention is not limited to this, but can also be applied to other semiconductor switches consisting of bipolar transistors, etc., which have the same problem as the semiconductor module consisting of MOS FETs.

Figure 4:
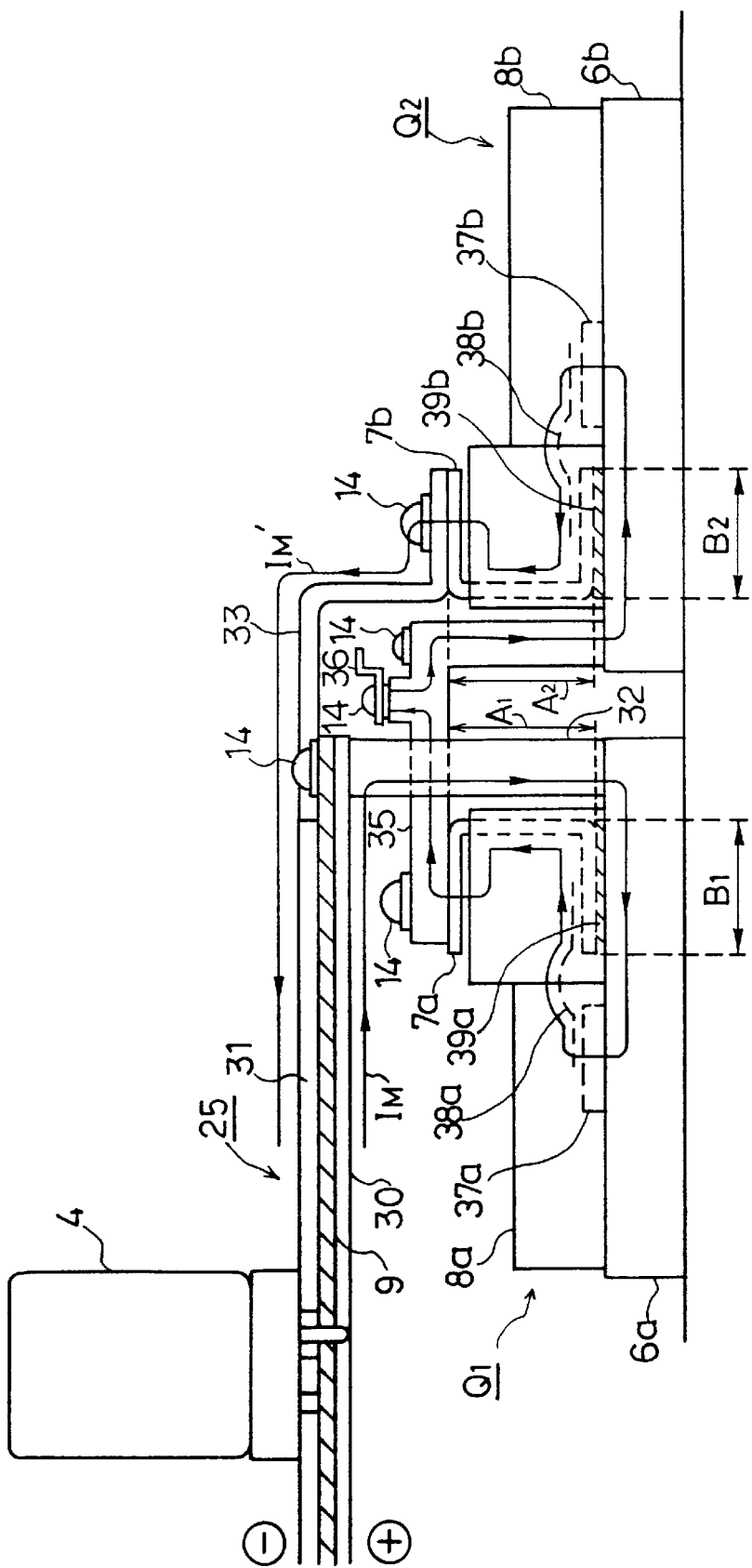
FIG. 4 is an extracted and enlarged side view showing the electrode connection structure of the present invention of a pair of semiconductor modules corresponding to a pair of upper and lower arms in a dual inverter structure.

First, FIG. 4 is the side view of a structure in which a pair of semiconductor modules Q1 and Q2 corresponding to a pair of upper and lower arms are connected to a dual inverter structure using the electrode terminal connection structure of the preferred embodiment of the present invention. Since a current flowing in a circuit is relatively small and gate electrodes are only mildly affected by wiring inductance, gate electrodes are omitted in FIG. 4.

In FIG. 4, a non-insulated semiconductor module in which base substrates 6a and 6b are also used as drain electrodes, is used in this preferred embodiment. Semiconductor chips 37a and 37b for performing on-off control using a control signal from a gate electrode, which is not shown in FIG. 4, are mounted on the base substrate 6a and 6b inside packages 8a and 8b, and the tops of the semiconductor chips 37a and 37b and the source electrodes 7a and 7b are connected using bonding wires 38a and 38b, respectively. The source electrodes 7a and 7b are in the shape of the Japanese character "⊐" open toward the semiconductor chips 37a and 37b. The bottom of the semiconductor chips 37a and 37b are mounted on the base substrates 6a and 6b after being electrically insulated from the base substrates 6a and 6b by inserting insulators 39a and 39b, and control current is inputtted through bonding wires 38a and 38b. The side of one of the semiconductor chips 37a and 37b is vertically installed parallel and close to the outer sides of the other semiconductor chip inside the packages 8a and 8b, and the top of the semiconductor chips 37a and 37b are installed horizontally on the packages 8a and 8b.

Two of the above-described semiconductor modules corresponding to a pair of upper and lower arms are arranged in parallel in such a way that the sides of source electrodes 7a and 7b are opposed, and an inter-module electrode terminal 35 connecting the source electrode 7a of the semiconductor module Q1 corresponding to the upper arm element and the drain electrode (base substrate) 6b of the semiconductor module Q2 corresponding to the lower arm element is made of a block of a conductive metal. One end of the inter-module electrode terminal 35 is connected to the top of the source electrode 7a of the Q1 semiconductor module and the other end is vertically installed parallel and close to the side of the source electrode 7b in the package 8b on the base substrate 6b of the semiconductor module Q2. Both the ends are secured with screws. Here, a block means an approximately rectangular parallelepiped having sufficient height, width and depth or a structure obtained by combining these approximately rectangular parallelepipeds.

Output to a three-phase motor to be fitted with an inverter is supplied from a load connecting part 36 installed in this inter-module electrode terminal 35.

A bus electrode plate 25 in which an insulation sheet 9 is inserted between two copper plates of a lower positive electrode 30 and a upper negative electrode 31 is horizontally positioned in the upper center region of an entire dual inverter structure, and the positive electrode terminal 32 made of a block of a conductive metal is installed so as to electrically connect the base substrate 6a of the semiconductor module Q1 and the lower positive electrode 30 of the bus electrode plate 25 and simultaneously to mechanically support the bus electrode plate 25.

The positive electrode terminal 32 is also vertically installed parallel and close to the side of the source electrode 7a in the package 8a of the semiconductor module Q1, and is secured with screws 14 passing through the top of the insulation sheet 9 of the bus electrode plate 25 to the base substrate 6a.

A negative electrode terminal 33 is formed by extending the upper negative electrode 31 of the bus electrode plate 25 up to the top of the source electrode 7b of the semiconductor module Q2, and is connected and secured with screws 14.

Next, the function of the connection structure of the electrode terminals in this preferred embodiment described above is described together with the current flow.

First, the bus electrode plate 25, which becomes the power supply of a dual inverter structure, is composed of two copper plates of a lower electrode 30 and an upper negative electrode 31 between which a thin insulation sheet 9 is inserted. Since both the copper plates are arranged parallel and close to each other, and input and output current flow is in almost opposite directions in the two copper plates, the wiring inductance due to a reciprocal induction function of the entire bus electrode plate 25 can be offset and reduced. In this case, for the insulation sheet 9 inserted between the copper plates, a material which electrically insulates the copper plates and easily transmits magnetic lines of force, is used.

With respect to the inverter, for functional reasons, two modules Q1 and Q2 forming a pair of arms never turn on simultaneously, current $I_M$ and $I_M$ flowing in the two modules Q1 and Q2, respectively, flow alternately between the lower positive electrode plate 30 and the load connecting part and between the upper negative electrode plate 31 and the load connecting part 30.

Figure 2:
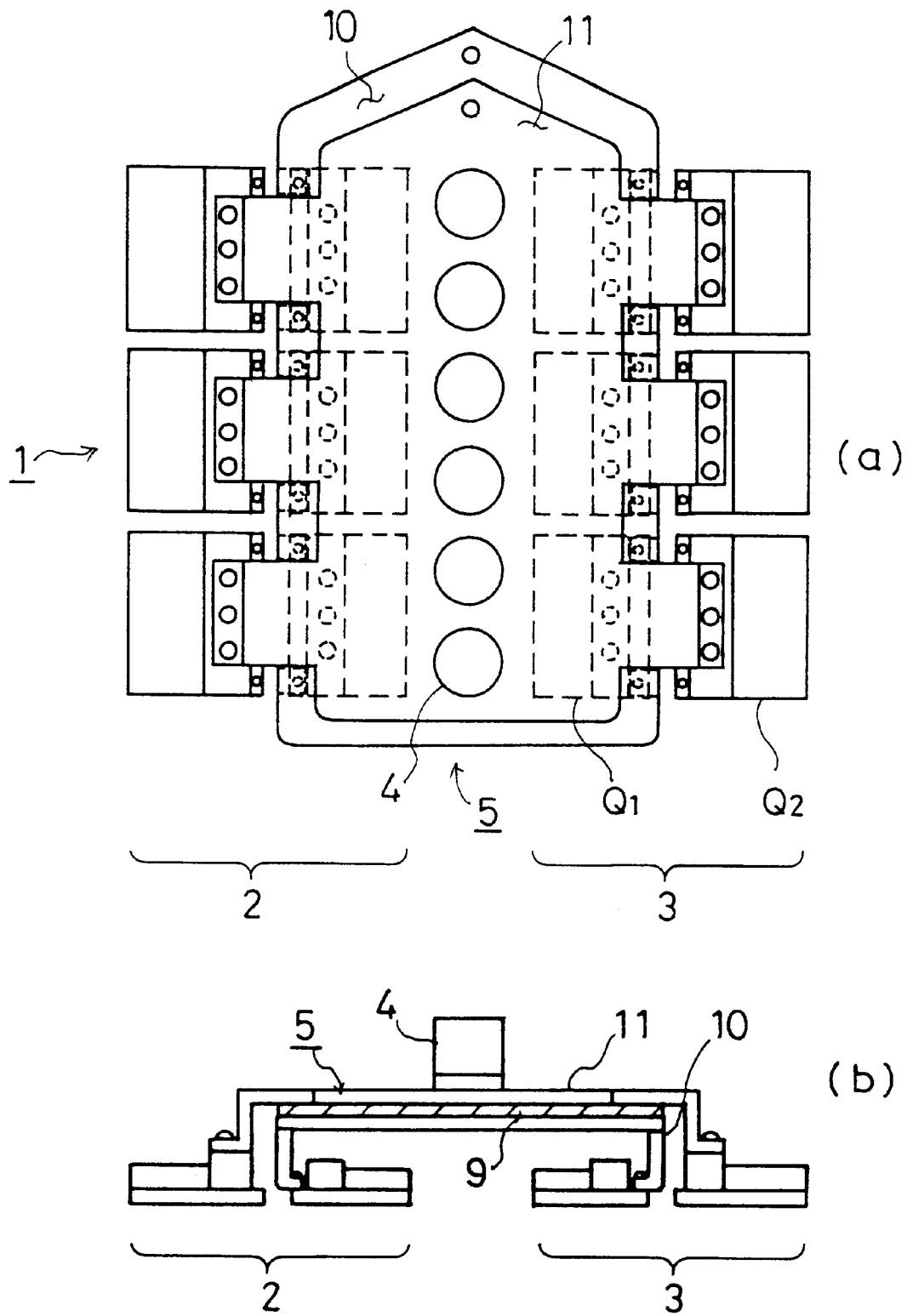
FIGS. 2A and 2B are simple diagrams of a top view and a side view, respectively, of a dual inverter structure.
Figure 3:
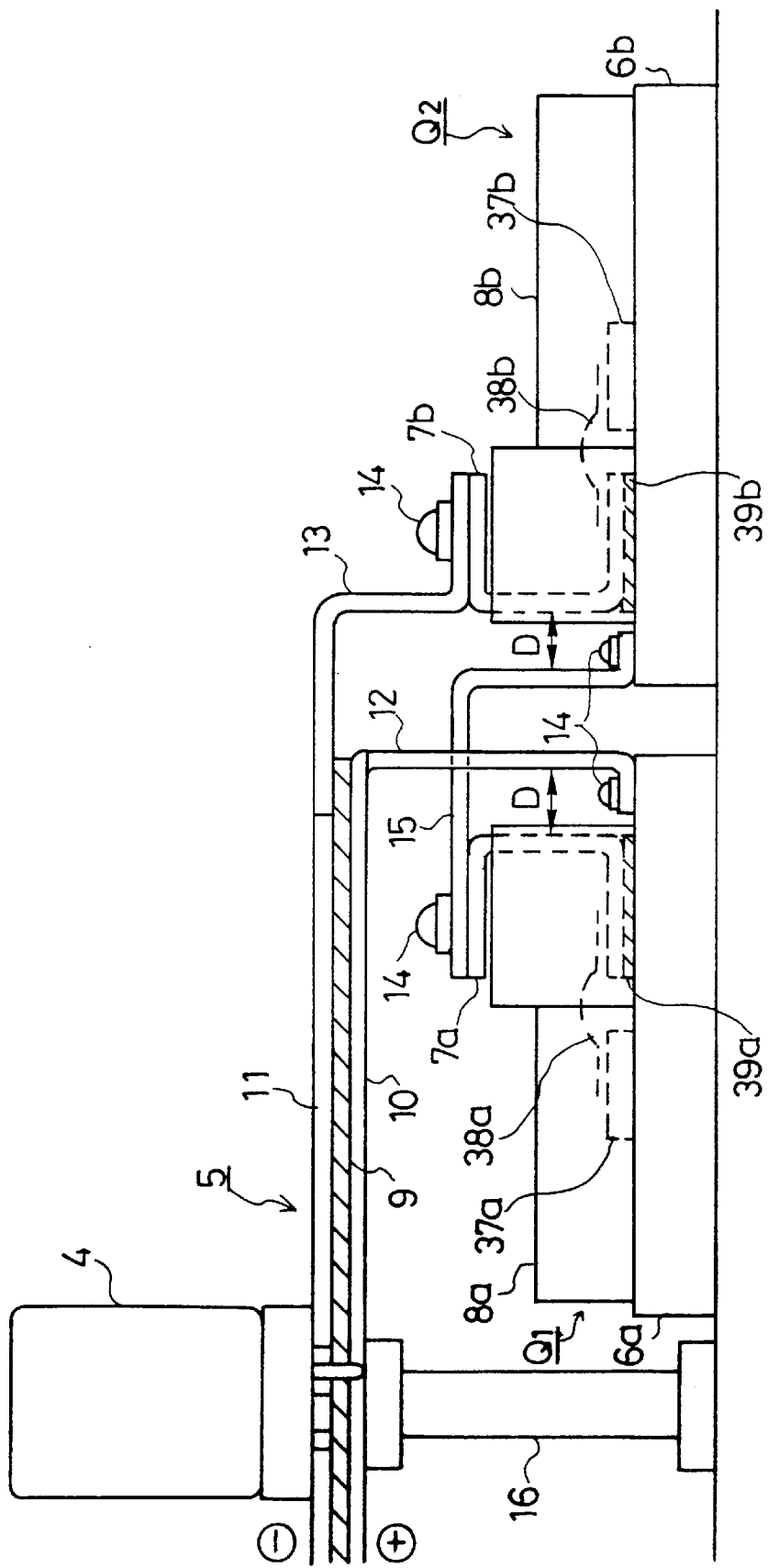
FIG. 3 is an extracted and enlarged side view showing a conventional electrode connection structure of a pair of semiconductor modules corresponding to a pair of upper and lower arms in a dual inverter structure.

When the semiconductor module Q1 and another semiconductor module located on the opposite side of a motor M (FIG. 2) are simultaneously turned on, current $I_M$ flows into the other semiconductor module from the semiconductor module Q1 through the motor M. In this case, the current $I_M$ flows along the following route. That is, the current $I_M$ vertically flows downward from the lower positive electrode plate 30 of the bus electrode plate 25 through the positive electrode terminal 32, is inputted to the base substrate 6a of the semiconductor module Q1, flows in the leftward direction in FIG. 2 through the base substrate 6a, passes through an energized semiconductor chip 37a mounted on the base substrate 6a, returns in the rightward direction in FIG. 2 through a bonding wire 38a, flows in the rightward direction on the bottom of the source electrode 7a, flows up the side, and at the top is outputted to the load connecting part 36 through the inter-module electrode terminal 35.

When the other semiconductor module Q2 and another semiconductor module located on the opposite side of a motor M (FIG. 2) are simultaneously turned on, current $I_M'$ flows into the semiconductor module Q2 from the other semiconductor module through the motor M. In this case, the current $I_M'$ flows along the following route. That is, the current $I_M'$ which flowed into the semiconductor module Q2 through the motor M after moving along the same route as the current $I_M$ in the other semiconductor module, first vertically flows downward through the vertical portion of the inter-module electrode terminal 35 from the load connecting part 36 of the inter-module electrode terminal 35, is inputted to the base substrate 6b of the semiconductor module Q2, flows in the rightward direction in the base substrate 6b, passes through an energized semiconductor chip 37b mounted on the base substrate 6b, returns in the leftward direction in FIG. 2 through a bonding wire 38b, flows in the leftward direction at the bottom of the source electrode 7b, flows up the side, and at the top is outputted to the negative electrode terminal 13, which is the extension of the negative electrode plate of the bus electrode plate 25.

Then, on the flow routes of $I_M$ and $IM^{M'}$ the vertical portions of two electrode terminals 32 and 35, shown as $A_1$ and $A_2$ in FIG. 4, and the sides of the source electrodes 7a and 7b of the semiconductor modules to be connected are arranged parallel and close to each other on the opposite sides of the sides of the insulating packages 8a and 8b. Since the energized directions of the current $I_M$ and $I_M'$ flowing in the electrode terminal and source electrode are in opposite directions, wiring inductance due to a reciprocal induction function can be offset and reduced, and thereby a remarkable reduction in surge voltage and switching loss can be realized compared with a semiconductor module connected to the conventional dual inverter structure.

This is because gaps required for attaching screws in the conventional structure between the inner side of a package in which a source electrode is vertically installed and an electrode terminal can be eliminated and because the inner side of the package and electrode terminal can be arranged close to and parallel with each other.

Since in the ranges $B_1$ and $B_2$ shown in FIG. 4, current flowing in the base substrates 6a and 6b which are also used as drain electrodes, and current flowing at the bottom of the source electrode 7a and 7b through bonding wires 38a and 38*b*, respectively, are arranged parallel with and close to each other and flow in opposite directions in the same conventional way, the same effect can be obtained even in the ranges $B_1$ and $B_2$ shown in FIG. 4.

As described above, since the positive electrode terminal 32 is made of a block of a conductive metal, has a characteristic peculiar to steel, and thereby supports the bus electrode plate 5 from the bottom at two points for each pair of semiconductor modules in a dual inverter structure, reinforcing materials, such as brackets, etc., which are conventionally required can be omitted, and thereby the simplification and light weight of a dual inverter structure can be realized.

As described above, according to the present invention, when semiconductor modules are connected to a dual inverter structure, wiring inductance due to a reciprocal induction function can be offset even in the sides of the source electrode in a package and the vertical portions of electrode terminals, and thereby a great reduction in both surge voltage and switching loss can be realized. Since due to the above-described effect, a small heat sink, a snubberless circuit, and reduced derating time, the number of semiconductor chips required can be reduced, and as a result, an improvement in the reliability of semiconductors as well as a reduction in the production cost can be realized.

Since the installation of reinforcing materials, such as brackets, etc., conventionally required to support the heavy weight of a bus electrode panel is not needed, the simplification and reduction in weight of a dual inverter structure can be realized.

What is claimed is:

1. An electrode terminal connection structure of a semiconductor module for connecting a non-insulated semiconductor module in which a conductive base structure is also used as an electrode for inputting main current, to a dual inverter structure, wherein:

an electrode terminal for inputting main current from outside the semiconductor module to the base substrate as an electrode for inputting main current is vertically installed on the base substrate in such a way that the electrode terminal is parallel with and close to an electrode terminal for outputting main current vertically installed inside a package of the semiconductor module, and current flows in opposite directions in two parallel and closely located portions, said electrode terminal for outputting main current is located in parallel with and close to a side of a package; and said electrode terminal for inputting main current is formed in a block shape which has depth from an edge of a substrate to a side of a package.

2. The electrode connection structure of a semiconductor module according to claim 1, wherein the electrode terminal formed in a block shape is secured to the base substrate with a screw passing through a top of the electrode terminal to the base substrate.

* * * * *

UNITED STATES PATENT AND TRADEMARK OFFICE
CERTIFICATE OF CORRECTION

PATENT NO. : 6,380,617 B1  Page 1 of 1
DATED : April 30, 2002
INVENTOR(S) : Sofue et al.

It is certified that error appears in the above-identified patent and that said Letters Patent is hereby corrected as shown below:

Column 6,
Line 1, please delete "$I_M$ and $I_M$" and insert therefor -- $I_M$ and $I_M'$ --;
Line 45, please delete "$I_M$ and $IM^M$" and insert therefor -- $I_M$ and $I_M'$ --;

Signed and Sealed this

Twenty-fourth Day of September, 2002

Attest:

Attesting Officer

JAMES E. ROGAN
*Director of the United States Patent and Trademark Office*